United States Patent
Tsironis

(10) Patent No.: US 10,700,402 B1
(45) Date of Patent: Jun. 30, 2020

(54) COMPACT MILLIMETER-WAVE TUNER

(71) Applicant: Christos Tsironis, Dollad-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 9 days.

(21) Appl. No.: 16/224,998

(22) Filed: Dec. 19, 2018

Related U.S. Application Data

(60) Provisional application No. 62/609,564, filed on Dec. 22, 2017.

(51) Int. Cl.
| | | |
|---|---|---|
| *H03H 7/38* | (2006.01) | |
| *H01P 5/04* | (2006.01) | |
| *H03H 7/40* | (2006.01) | |
| *H01R 9/05* | (2006.01) | |
| *H03H 1/00* | (2006.01) | |
| *G01R 31/28* | (2006.01) | |

(52) U.S. Cl.
CPC ............ *H01P 5/04* (2013.01); *H01R 9/0524* (2013.01); *H03H 7/40* (2013.01); *G01R 31/2824* (2013.01); *H03H 2001/0057* (2013.01); *H03H 2007/386* (2013.01)

(58) Field of Classification Search
CPC ... H03H 7/38; H03H 7/40; H01P 1/18; G01R 27/2694; G01R 27/02; G01R 25/02
USPC .................... 333/263, 17.3, 32, 33
See application file for complete search history.

(56) References Cited

U.S. PATENT DOCUMENTS

| | | |
|---|---|---|
| 9,257,963 B1 | 2/2016 | Tsironis |
| 9,625,556 B1 | 4/2017 | Tsironis |
| 10,345,422 B1* | 7/2019 | Tsironis .............. G01R 27/32 |

OTHER PUBLICATIONS

Load Pull [online], Wikipedia [retrieved on Nov. 18, 2016], Retrieved from Internet <URL:http://en.wikipedia.org/wiki/Load_pull>.
"Computer Controlled Microwave Tuner—CCMT", Product Note 41, Focus Microwaves, Jan. 1998.
Standing wave ratio, VSWR, [online], Wikipedia [retrieved on Feb. 3, 2017], Retrieved from Internet <URL:https://en.wikipedia.org/wiki/Standing_wave_ratio>.
"High Resolution Tuners Eliminate Load Pull Performance Errors", Application Note 15, Focus Microwaves, Jan. 1995.
The TRL calibration method in "Calibration Techniques of Network Analyzers for Tuner Characterization", Application Note 13, Focus Microwaves, May 1994, pp. 3 to 5.
Eric Stud, "On-Wafer Measurements With the HP 8510 Network Analyzer and Cascade Microtech Wafer Probes", Appl. Note A-134, Hewlett Packard corp. pp. 10 and 15, 1986.

\* cited by examiner

*Primary Examiner* — Stephen E. Jones

(57) ABSTRACT

A compact millimeter-wave slide screw impedance tuner allows reducing to a minimum the insertion loss between the tuner and the wafer-probe. The structure of the tuner uses a 1 mm slabline and adapters, an eccentrically rotating remotely controlled wideband tuning probe and a sliding rack on which the tuning-probe is attached; the position of the rack is controlled by a permanently anchored motorized pinion. The construction method allows for maximum compactness, needed in order to be able to attach the tuner directly on the wafer-probe and minimize the insertion loss, while maintaining key advantages of electro-mechanical tuners, such as robustness, linearity, simplicity, tuning resolution and calibration and compatibility with existing load pull software and technology.

8 Claims, 14 Drawing Sheets

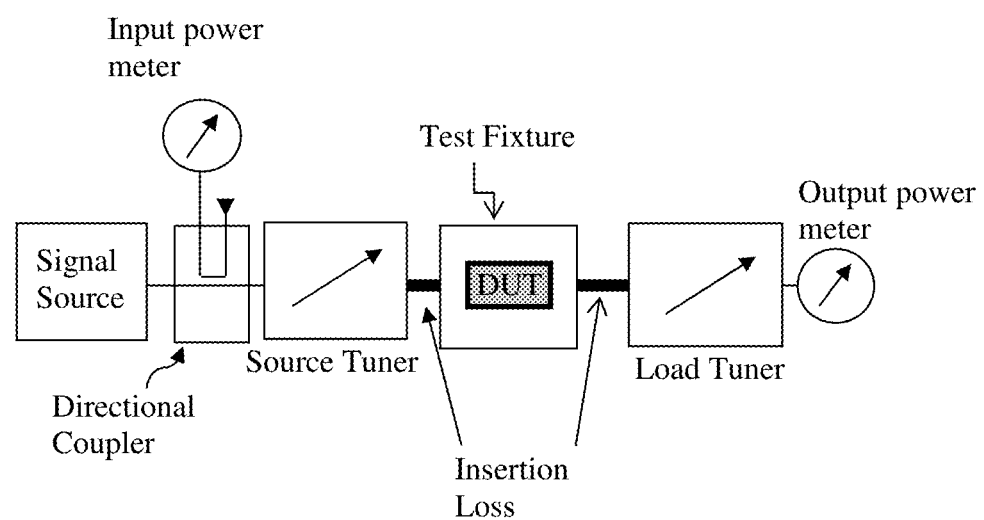
FIG. 1: Prior art

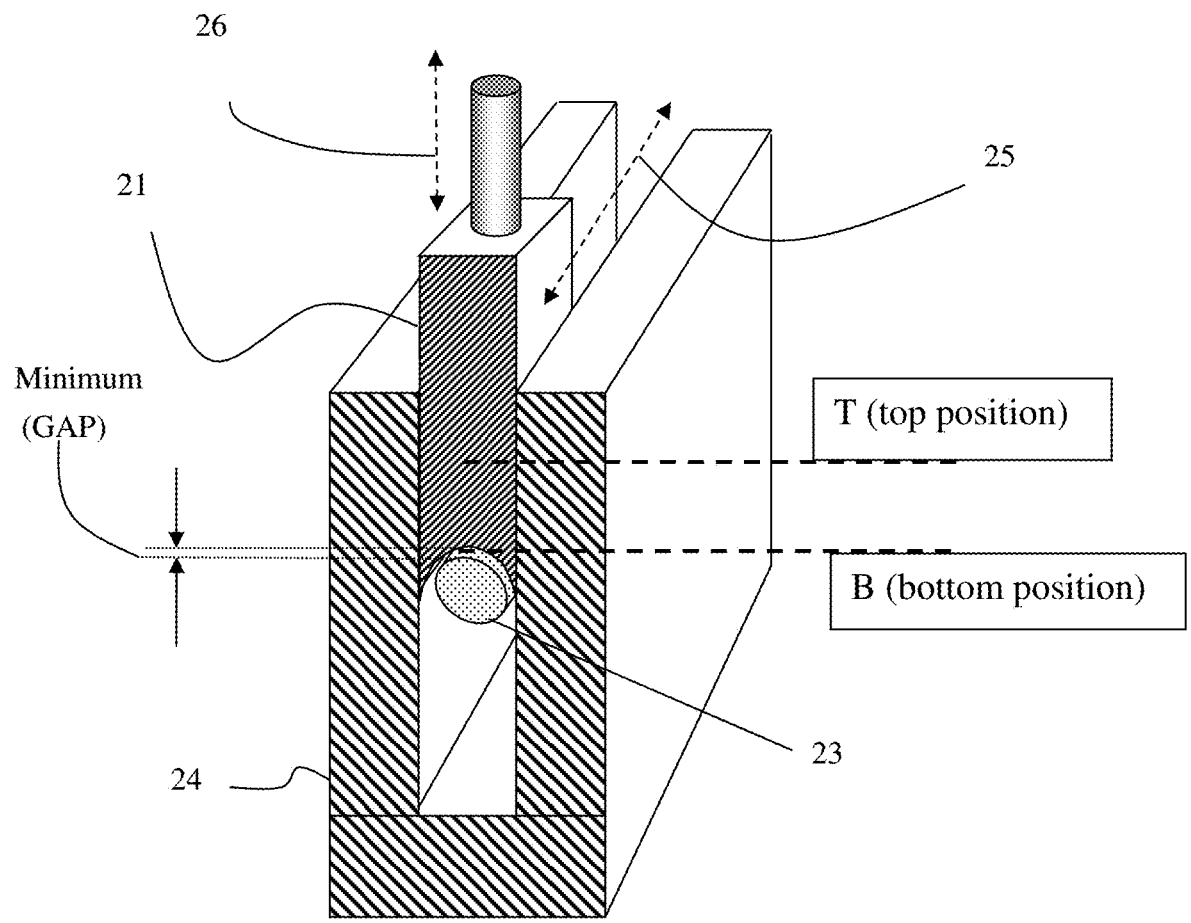
FIG. 2: Prior art

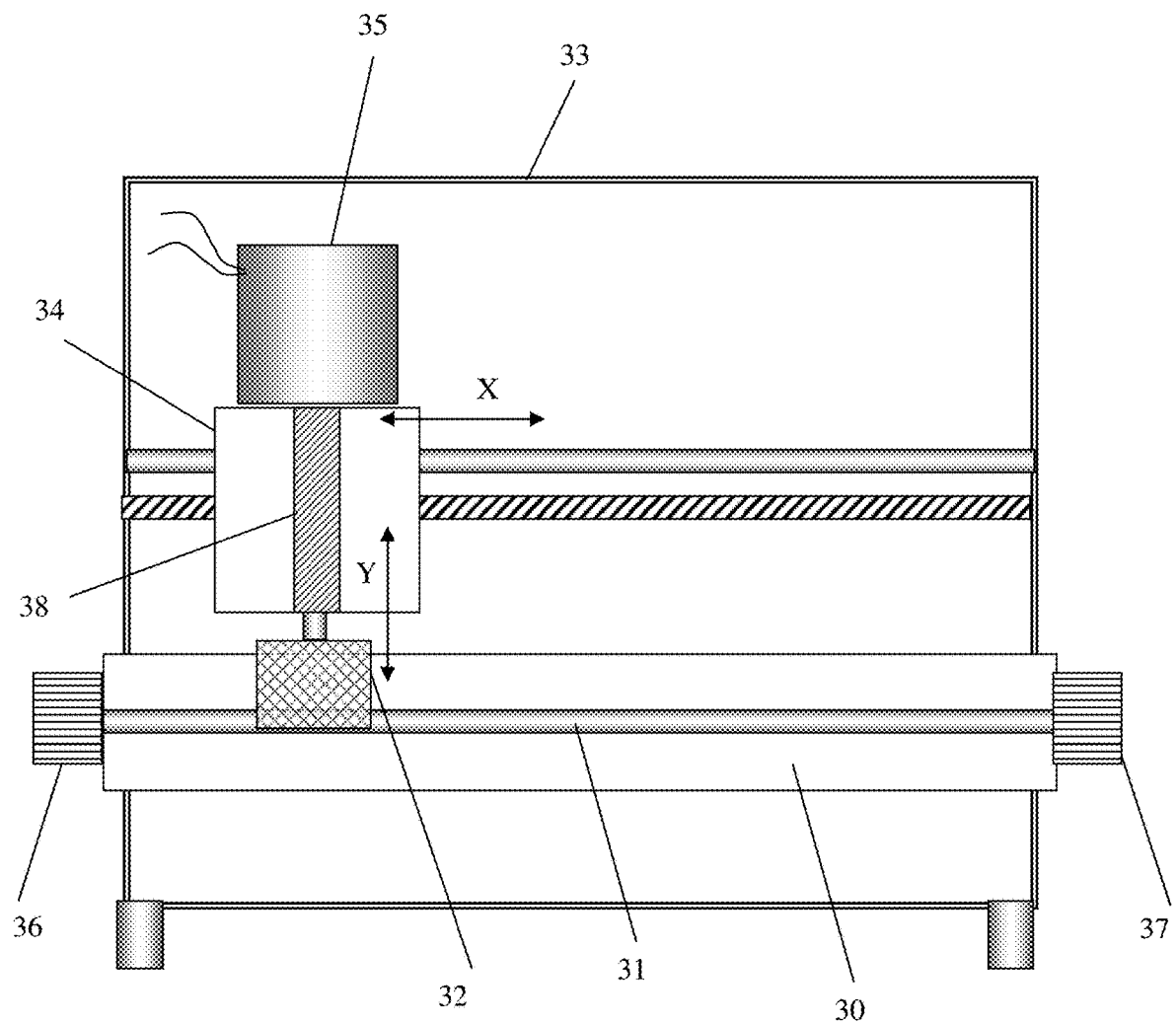
FIG. 3: Prior art

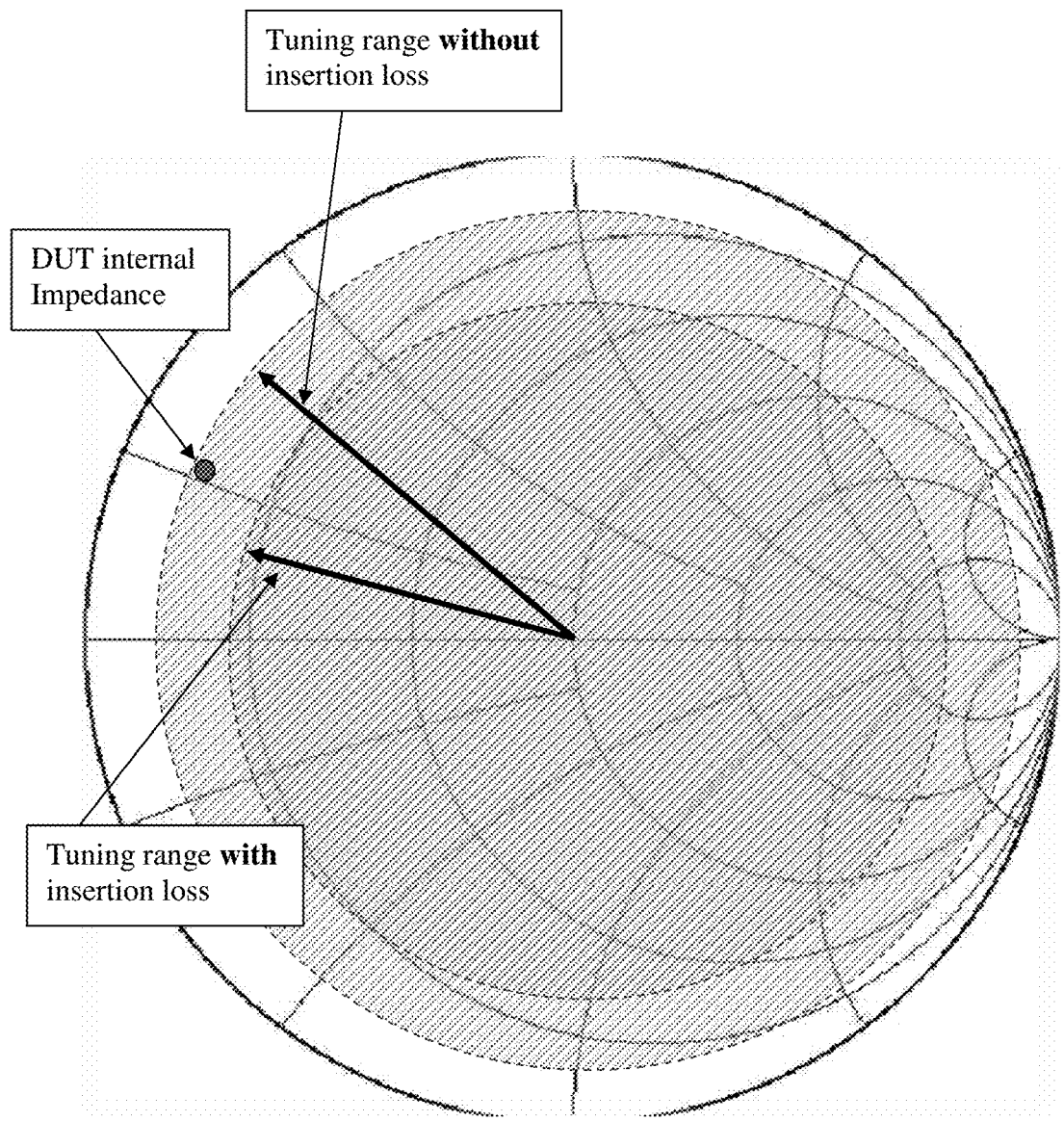
FIG 4: Prior art

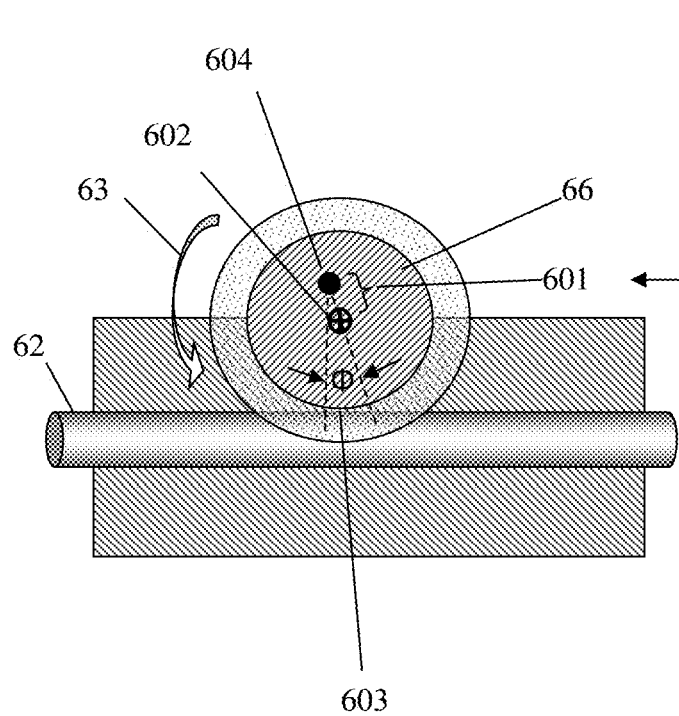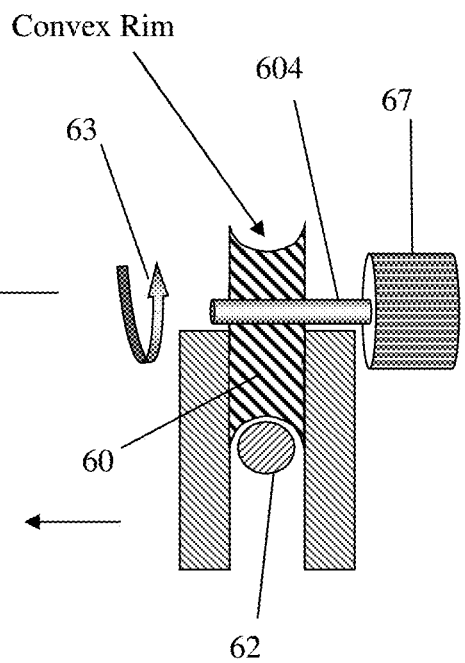
FIG. 6A: Prior art                    FIG. 6B: Prior art

FIG. 8: Prior art

FIG. 10A: Prior art
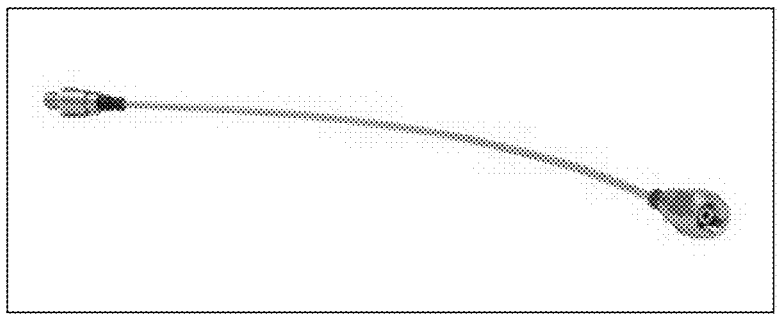
FIG. 10B: Prior art
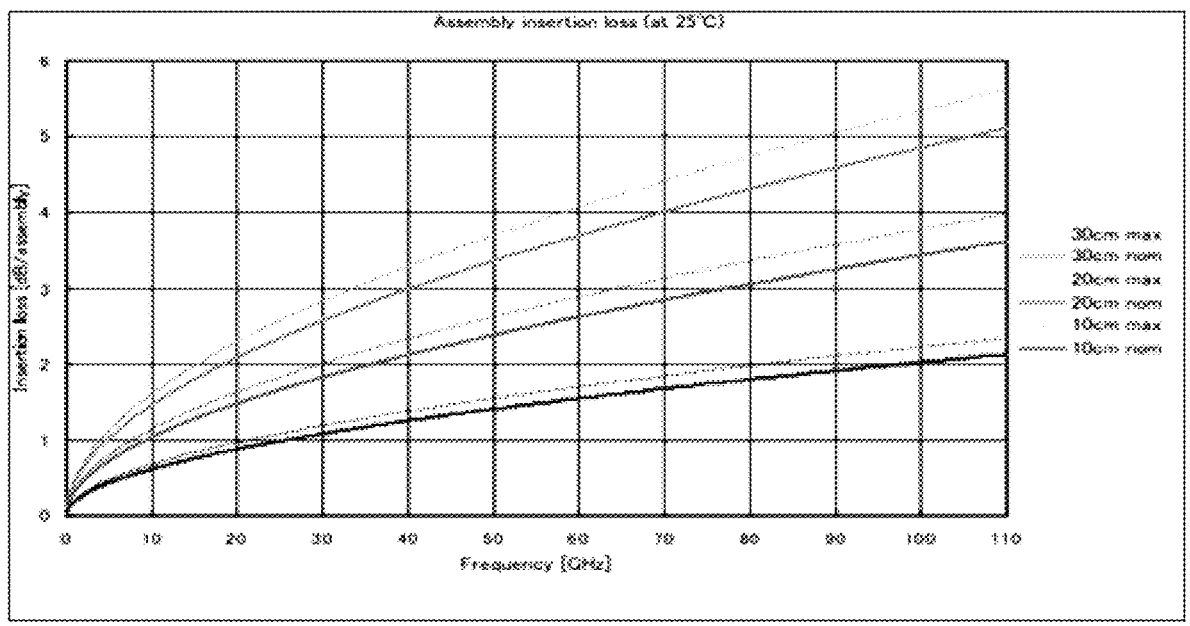

FIG. 14A: Prior art
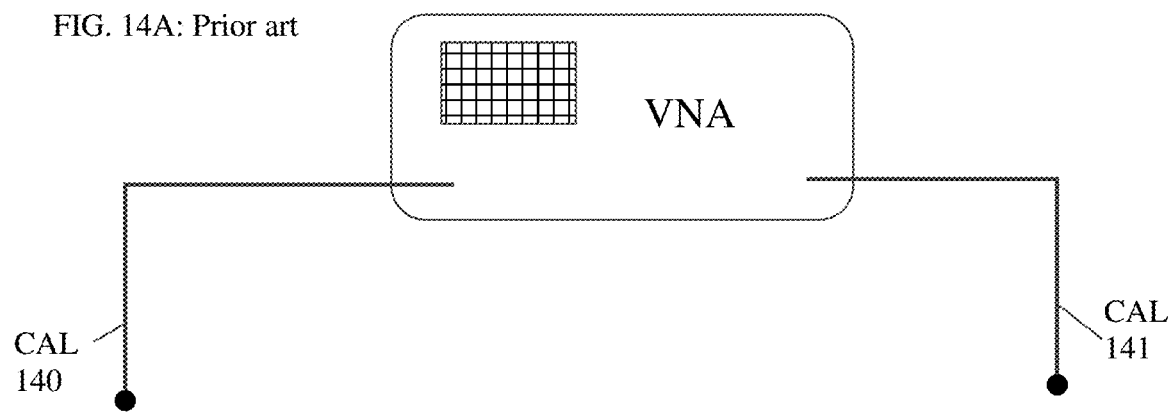
FIG. 14B
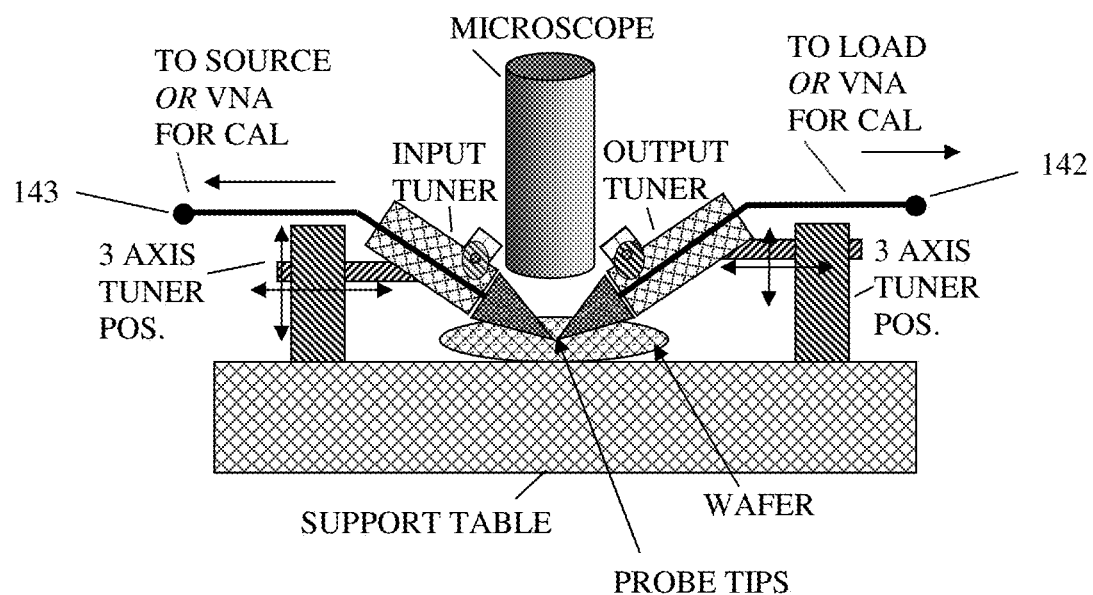

COMPACT MILLIMETER-WAVE TUNER

PRIORITY CLAIM

This application claims priority on provisional application No. 62/609,564, filed on Dec. 22, 2017, titled: "COMPACT MILLIMETER-WAVE TUNER".

CROSS-REFERENCE TO RELATED ARTICLES

1. Load Pull [online], Wikipedia [retrieved on 2016 Nov. 18], Retrieved from Internet <URL:http://en.wikipedia.org/wiki/Load_pull>.
2. "Computer Controlled Microwave Tuner—CCMT", Product Note 41, Focus Microwaves, January 1998.
3. Standing wave ratio, VSWR, [online], Wikipedia [retrieved on 2017 Feb. 3], Retrieved from Internet <URL: https://en.wikipedia.org/wiki/Standing_wave_ratio>.
4. "High Resolution Tuners Eliminate Load Pull Performance Errors", Application Note 15, Focus Microwaves, January 1995.
5. TSIRONIS, C. U.S. Pat. No. 9,625,556, "Method for Calibration and tuning using impedance tuners".
6. The TRL calibration method in "Calibration Techniques of Network Analyzers for Tuner Characterization", Application Note 13, Focus Microwaves, May 1994, pages 3 to 5.
7. TSIRONIS, C. U.S. Pat. No. 9,257,963, "Impedance tuners with rotating probes".
8. Eric Strid, "ON-WAFER MEASUREMENTS WITH THE HP 8510 NETWORK ANALYZER AND CASCADE MICROTECH WAFER PROBES", Appl. Note A-134, Hewlett Packard corp. pages 10 and 15.

BACKGROUND OF THE INVENTION

This invention relates to RF load and source pull testing of low noise as well as medium and high power RF transistors and amplifiers at millimeter-wave frequencies.

Modern design of low noise or high power RF amplifiers and mixers, used in various communication systems, requires accurate knowledge of the active device's (microwave transistor's) characteristics. In such circuits, it is insufficient for the transistors, which operate either as very low noise or as highly non-linear devices, close to power saturation, to be described using linear or non-linear numeric models.

A popular method for testing and characterizing such microwave components (transistors) in the non-linear region of operation is "load pull" or "source pull" (see ref. 1). Load/source pull is a measurement technique employing microwave impedance tuners and other microwave test equipment (FIG. 1), such as signal source, source (input) and load (output) tuner, input and output power meter and test fixture which holds the DUT. The tuners and equipment are controlled by a computer via digital communication cables. The microwave impedance tuners are devices which allow manipulating the RF impedance presented to the Device Under Test (DUT, or transistor) to test (see ref. 1); this document refers hence to "impedance tuners", (see ref. 2), in order to make a clear distinction from "tuned receivers (radios)", popularly called elsewhere also "tuners" because of the included frequency tuning circuits (impedance tuners versus frequency tuners).

Electro-mechanical impedance tuners (FIGS. 2 and 3) in the microwave and low millimeter-wave frequency range typically between 100 MHz and 60 GHz are using the slide-screw concept: it comprises a parallel plate low loss airline (slabline, (24), (30)) with a test port (36) and an idle port (37), a center conductor (23, 31) and one or more mobile carriages (34) which carry a motor (35), a vertical axis (38), which controls the vertical position of a reflective probe (32), see ref. 2. The carriages are moved horizontally by additional motors (not shown) and gear. The signal enters one port (36) and exits from the other (37). In load pull the test port is the one where the signal enters, in source pull the test port is the one where the signal exits, FIG. 3 shows a load tuner. The entire mechanism is, typically, integrated in a solid housing (33) since mechanical precision is of highest importance. Millimeter-waves occupy the frequency spectrum from approximately 30 GHz to 300 GHz. The wavelength ($\lambda$) is in the 10 mm to 1 mm range. The wavelength is calculated as: $\lambda$[mm]=300/frequency[GHz]. The tuners in this invention operate from 20 to 110 GHz, corresponding to wavelengths between 15 and 2.72 mm A slide screw tuner must allow horizontal travel of the tuning probe of one half of a wavelength, or, in the case of the lowest frequency (20 GHz), at least 7.5 mm, in order to allow for a 360° rotation of the created reflection factor (the reflection phase is double the transmission phase).

The typical configuration of the reflective probe inside the slabline is shown in FIG. 2: a parallel reflective tuning element (21) also called "tuning" probes or slug, is inserted into the slotted transmission airline (24) and coupled capacitively with the center conductor (23) to an adjustable degree, depending from very weak (when the probe is withdrawn) to very strong (when the probe is very close (within electric discharge—or Corona) to the center conductor; it must be pointed that capacitive "tuning" probes are different from electro-magnetically coupled "sampling" probes, which are loosely coupled with the center conductor; when the tuning probes move vertically (26) between a "top position" and a "bottom position" and approach the center conductor (23) of the slabline (24) and moved along the axis (25) of the slabline, they alter the amplitude and phase of the reflection factors seen at the slabline ports, covering parts or the totality of the Smith chart (the normalized reflection factor area). The relation between reflection factor and impedance is given by GAMMA=(Z−Zo)/(Z+Zo), where Z is the complex impedance Z=R+jX and Zo is the characteristic impedance. A typical value used for Zo is 50Ω (Ohm) (see ref. 3). In a 50Ω test system (i.e. when the tuner is terminated at both ports with 50Ω), GAMMA is equal to the first element of the tuner twoport s-parameter matrix: GAMMA=S11, also expressed as Standing Wave Voltage Ratio VSWR (see ref. 3).

Up to now such metallic tuning probes (slugs) (FIG. 2) have been made in a cubical form (21) with a concave bottom, which allows capturing, when approaching the center conductor (23), the electric field on the sides, where it is concentrated in the closest space between the center conductor and the ground planes of the slabline. This field capturing allows creating high and controllable reflection factors. The compact millimeter-wave tuner disclosed here uses rotating probes (see ref. 7); these probes can be circular and rotate eccentrically, or can be oval, or elliptical and rotate centered or eccentrically (FIG. 6). The important feature is for the coupling factor (or the penetration of the disc body into the slabline) to be controllable only through the angle of rotation. This allows avoiding cumbersome vertical axis structures (38) in FIG. 3).

The interconnections between tuning probe inside the tuner and the wafer-probe introduce, especially at millimeter-wave frequencies, insertion loss (FIGS. 1, 8 (item 87)

and 10B), which reduces the tuning range of the tuner and by consequence the capability of the tuner to conjugate match many transistors (FIG. 4). It is therefore of primary importance to reduce or eliminate the interconnections. The new compact tuner allows doing this, because it can be mounted, at the appropriate angle, directly on the wafer-probe.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a typical automated transistor load and source pull test system.

FIG. 2 depicts prior art, parallelepiped RF probe (slug) inside a slotted airline (slabline) approaching the center conductor in a perspective view and the relevant dimensions and parameters of the operation.

FIG. 3 depicts prior art, a front view of an automated slide screw impedance tuner using a single vertical axis and RF tuning probe (slug).

FIG. 4 depicts prior art, the effect of the insertion loss of the interconnection between tuner and wafer-probe on the tuning range.

FIG. 5A depicts a front view of the mechanism; FIG. 5B depicts a perspective view.

FIGS. 6A through 6B depict prior art: the tuning mechanism of the disc probe; FIG. 6A depicts a side view; FIG. 6B depicts a cross section.

FIGS. 10A through 10B depict prior art: a millimeter-wave flexible cable; FIG. 10A depicts a photograph of a commercially available cable; FIG. 10B depicts a chart of insertion loss of the flexible RF cable assembly (item 80, in FIG. 8).

FIGS. 14A through 14B depict prior and new art, VNA configuration and test setup; FIG. 14A depicts prior art: VNA using coaxial cables for calibration purposes;

FIG. 14B depicts source and load pull on-wafer test setup comprising compact tuners.

DETAILED DESCRIPTION OF THE INVENTION

Figure 5A:
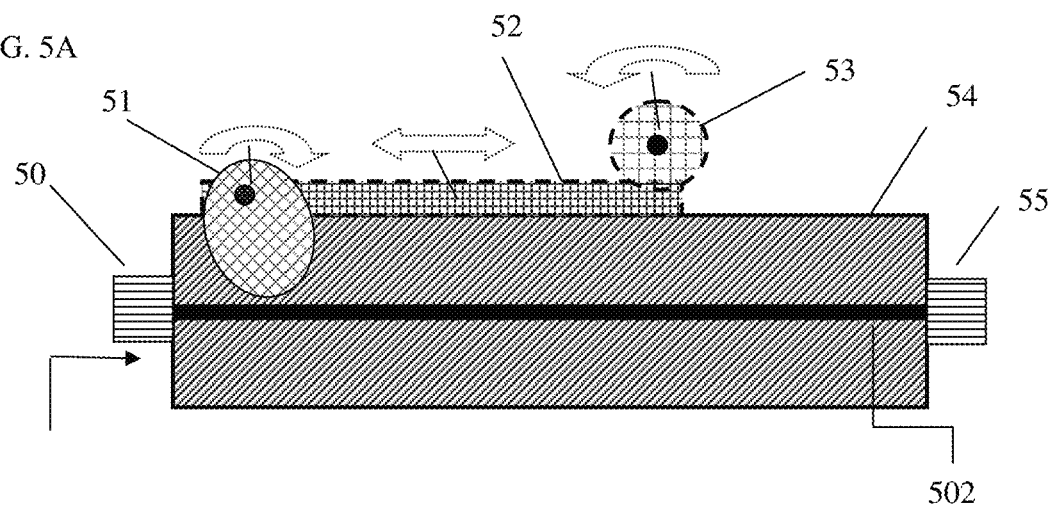
FIGS. 5A through 5B depict the concept of compact millimeter-wave tuner; using a "mobile rack and fixed pinion" horizontal movement.
Figure 5B:
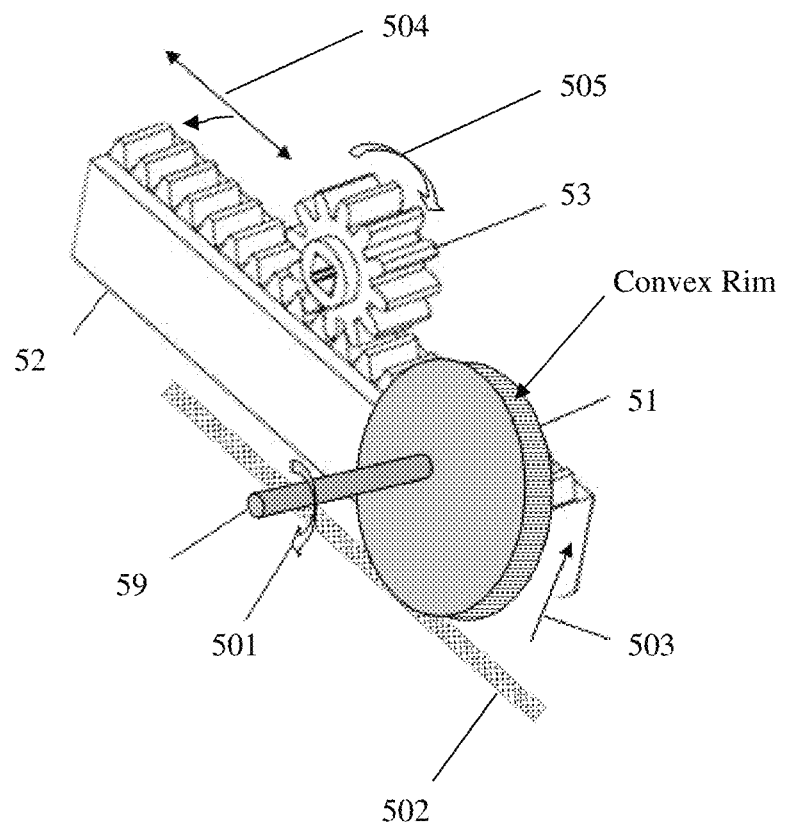

This invention discloses a new compact slide screw impedance tuner structure, the millimeter-wave tuner system and the associated load and source pull test setup. Other than any prior art the new tuner structure comprises the following key components (FIGS. 5, 6 and 9):

A. Short slabline directly attached to the wafer-probe (FIGS. 5A and 9),
B. Eccentrically rotating disc-probe (FIG. 6),
C. Mobile carriage in form of a sliding rack gear (FIG. 5B).

The effect of using the new structure allows minimizing the insertion loss between the tuner and the wafer-probe, increasing this way critically the tuning range in millimeter-wave frequencies. Tuning range is the most important performance criterion of a tuning system, as is shown in FIG. 4; the tuning range is reduced twice by the insertion loss between the tuning probe and the DUT. Reflection factor is defined as the inverse ratio between departing and returning signal power waves. Obviously, the energy leaving the DUT (or the wafer-probe) loses a part on its way to the tuning probe. After being reflected at the tuning probe the energy loses again a part on its way back to the DUT. The reflection factor created at the DUT is therefore reduced by twice the insertion loss; i.e. if the insertion loss is IL=1 dB (FIG. 10B), then the reflection factor created by the tuner at the tuning probe Γt is reduced by 2×IL (=2 dB), or a Γt=0.9, becomes Γdut=0.71; this means any DUT having an internal impedance Rout<8.26Ω cannot be matched by the specific tuning system. This is very often the case. On the other hand, if the insertion loss is reduced from 1 dB to 0.2 dB, then, under the same conditions, the smallest internal impedance Rout is 3.7Ω, allowing most transistors to be tested under matched conditions.

Figure 8:
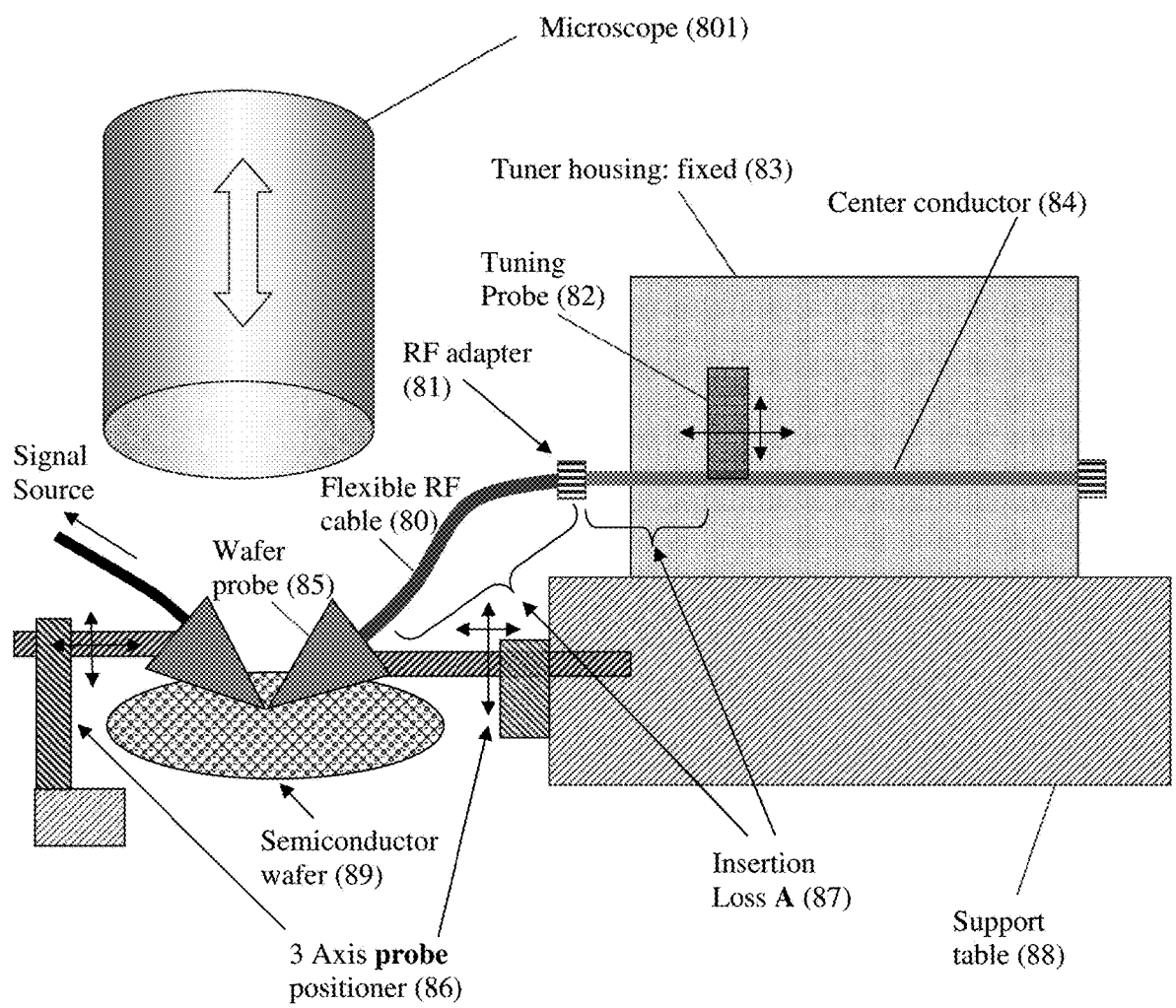
FIG. 8 depicts prior art: typical on-wafer tuning test setup using traditional tuners of FIG. 3 and flexible RF cable to connect the tuner to the wafer-probe.

In the frequency range 20-110 GHz, pertaining to be the main application of this invention, cable loss is high (see FIG. 10B). Including the two adapters a 10 cm long cable assembly (FIG. 10A) has as high as 2.3 dB insertion loss, a 20 cm cable assembly has 3.8 dB and a 30 cm cable assembly 5.3 dB. A typical prior art setup, as shown in FIG. 8, requires a 20 cm cable assembly (80) (flexible RF cable). The insertion loss of such a component renders the solution useless. Including additional typical insertion loss of the wafer-probe of 1 dB the total insertion loss would be 4.5-5 dB practically eliminating the tuning capability even of the best tuner: if a quasi-perfect tuner creates a reflection factor of 0.9 then at the DUT remains a reflection factor of 0.44 allowing matching internal impedance not lower than 19Ω.

The solution proposed here reduces insertion loss to less than 0.5 dB, in which case (including the 1 dB loss of the wafer-probe) the residual reflection factor of the previous tuner will be 0.64 allowing matching internal impedances of roughly log. At 110 GHz most transistors have internal impedance of this order of magnitude due to inevitable internal parasitic capacitors, and can therefore be matched.

On the other hand a mobile carriage (34) and vertical axis with tuning probe (32), as shown in FIG. 3, is mechanically so cumbersome, that, in a required housing as big as item (83) it cannot be used in a tuner that can be attached at an angle to the wafer-probe (85), in order to eliminate the cable and avoid conflict with the microscope (801). In the case of the test setup comprising the compact new tuner (FIG. 9), the 3-axis tuner micro-positioner and associated auxiliary test instruments, such as signal source, power meter, spectrum analyzer and other (see ref. 1), this conflict is obviously avoided. In case of a single output tuner, the input wafer-probe is controlled by a wafer-probe micro-positioner (901).

Figure 9:
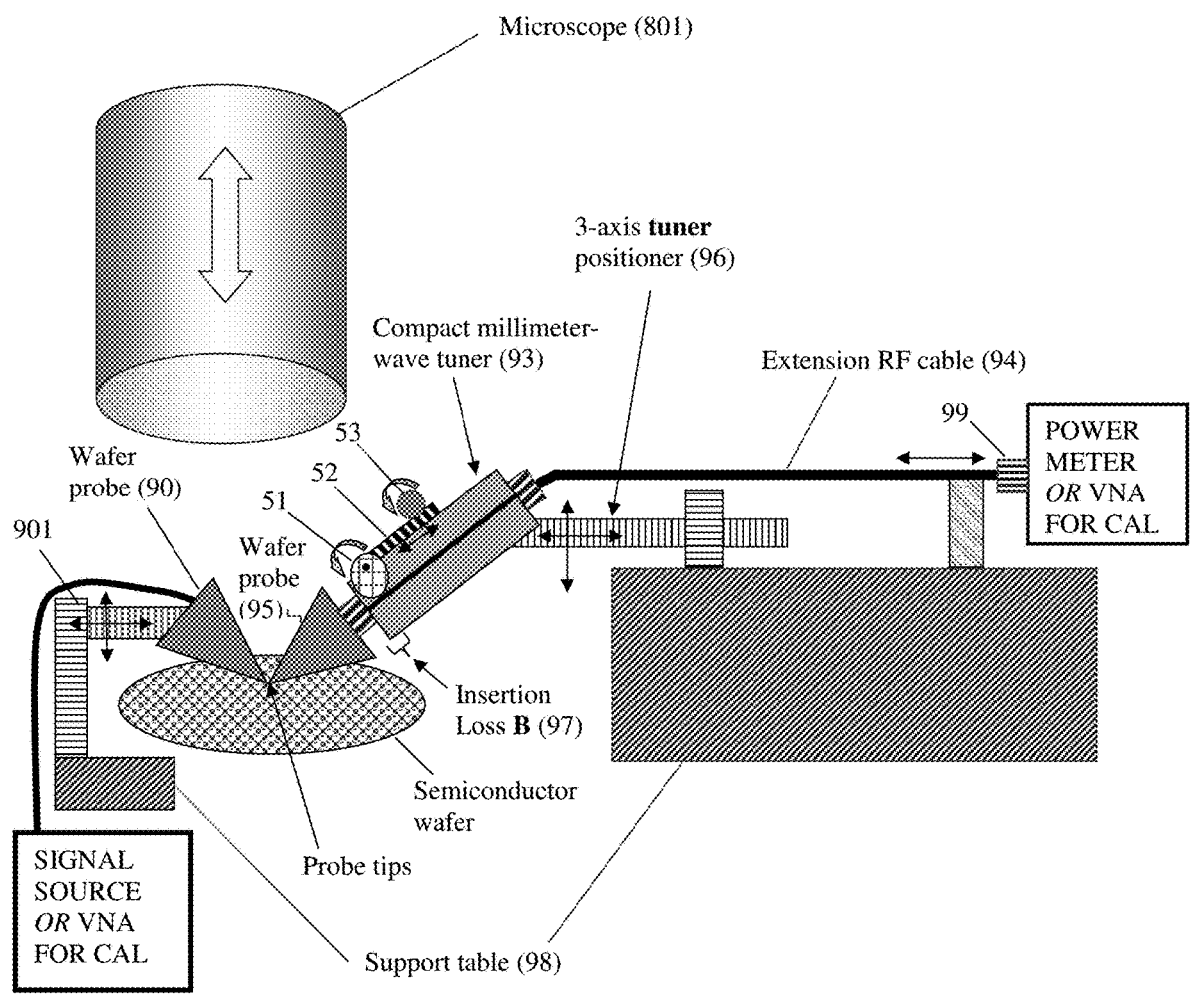
FIG. 9 depicts high Gamma on-wafer load pull tuning system setup using the compact millimeter-wave tuner of FIG. 5, and other required equipment of a load pull test setup (signal source, power meter etc.).
Figure 11:
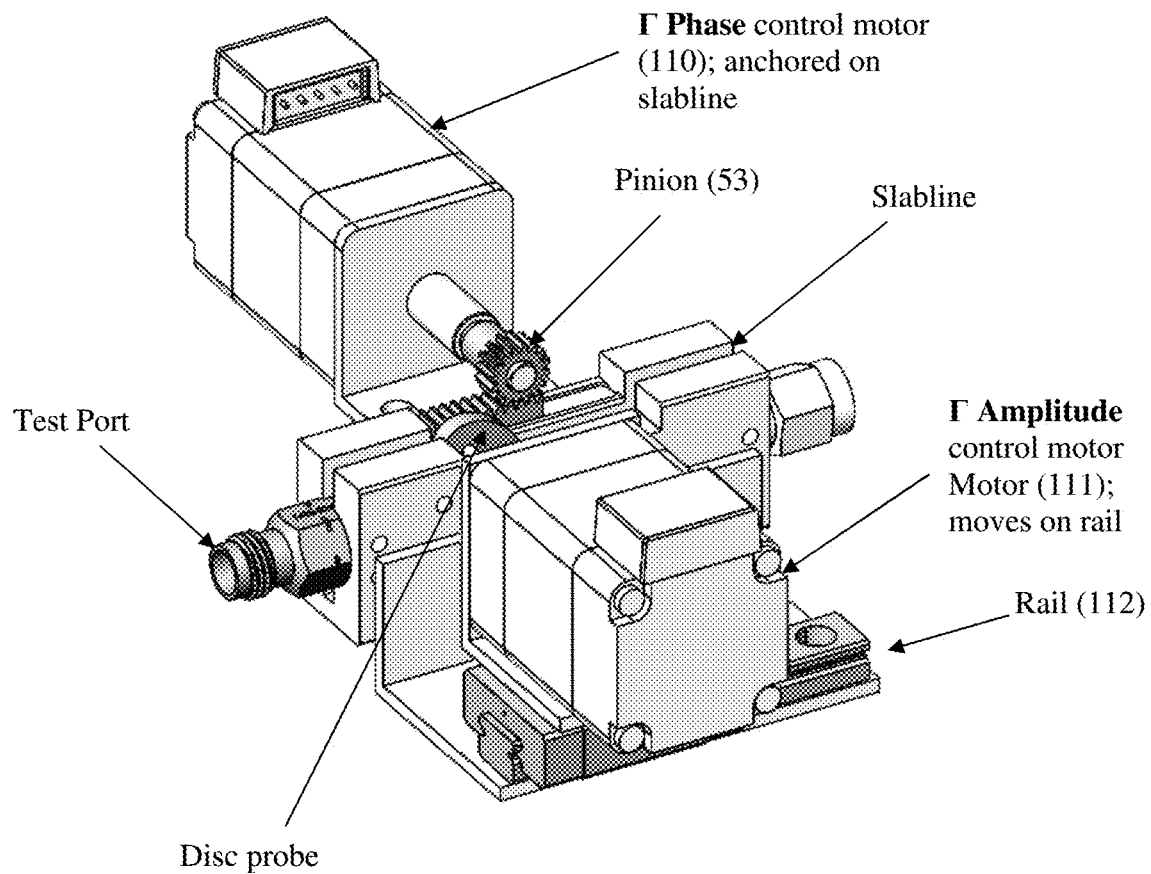
FIG. 11 depicts an overall 3D view of the compact millimeter-wave tuner.

The load pull test setup of FIG. 9 can, obviously, be extended to become a source and load pull test setup, when a second compact tuner is mounted, quasi symmetrical, on the input side, between the signal source and the input port of the DUT (FIG. 14B). The input wafer-probe and the idle ports of the tuners are connected to the auxiliary test instruments using flexible extension RF cables, to allow for free movement and control of the tuners and the wafer-probes through the 3-axis tuner and/or wafer-probe micro-positioners. The test ports of the tuners are closest to the tuning probes as shown in FIGS. 9, 11 and 14. Therefore the input and output tuners are symmetrical relative to the DUT, in a way for the test ports to always be closest to the DUT for maximum tuning range.

The new tuner structure is shown in FIG. 5: it comprises a low loss slabline (54) with a center conductor (502), a test port (50), an idle port (55) and a mobile rack (52), which slides on the top surface of one of the slabline walls. The rack's horizontal position (504) is controlled by a pinion (53) which is attached to a motor (110), the "F-Phase motor" in FIG. 11, and rotates (505) pushing the rack (52) back and forth; there is no vertical axis, as is, instead, the case in FIG. 3. In this invention a disc probe is used (see ref. 7); the disc probe (51), that can be circular or oval, is attached to the axis (59) of a second motor (111), the "F-Amplitude motor" (FIG. 11); when the probe rotates (501) eccentrically (601) (FIG. 6) it controls the amplitude of the reflection factor T at the test port (50) by changing the vertical position of the probe core (503). Of course, eccentricity is required when the disc-probe is circular. If the disc-probe is elliptical or oval the rotation center can be the identical with the geometrical center.

Figure 7:
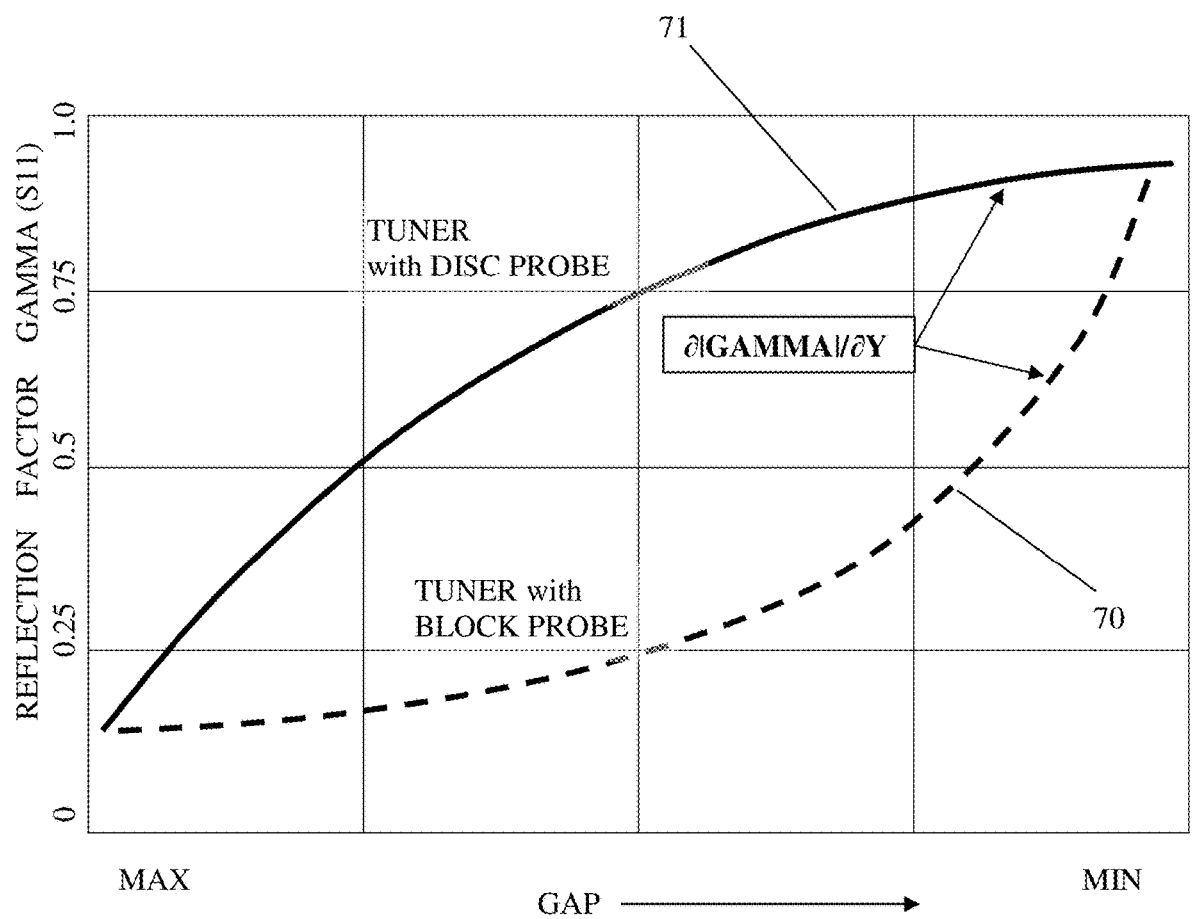
FIG. 7 depicts the reflection factor and tuning sensitivity of a block tuning probe (FIG. 3) versus a disc tuning probe (FIG. 6).

The full tuning mechanism of the eccentrically (601) rotating (63) disc probe (60) is shown in FIG. 6: In a circular disc-probe the eccentricity is controlled by the distance between the rotation axis (604) and the geometrical center (602) of the disc (60). Rotation angle F (603) is controlled by a stepper motor (67), on who's axis (604) the disc-shaped tuning probe (60) is attached. The eccentricity of the rotation brings the core (66) of the disc probe closer (insertion) or further away (withdrawal) from the center conductor (62) adjusting, this way, the coupling and by that the amplitude of the reflection factor |Γ|. Tuning with a disc probe is more efficient than tuning with a block probe (21, 32), especially concerning tuning sensitivity at high |Γ|; this is shown in FIG. 7. The gap between center conductor and probe is better controlled (71) using a disc-probe than a block probe (70). This means that tuning accuracy, which is directly related to mechanical repeatability, is better when the sensitivity ∂|GAMMA|/∂Y at high Γ is smaller (71).

To understand the benefits the new tuner offers, one must compare with the full configuration of prior art solutions, in FIG. 8: Hereby a massive tuner box (83) rests on a probe station table (88). The test port of the tuner (81) has a coaxial adapter which is connected to a flexible RF cable (80); this cable is connected to the wafer-probe (85), which finally contacts the chip (DUT) on the semiconductor wafer (89). The probe's position is controlled by a 3 axis (X-Y-Z) probe micro-positioner (86); relevant for the tuning range (FIG. 4) is the insertion loss of part of the center conductor (84), the section (87) between the chip (DUT) and the tuning probe (82), of which, in addition, of course, of the loss of the wafer-probe (85) which is inevitable and outside of the subject matter of this invention. This configuration is mandatory, also because of the microscope (801); would the tuner (83) be mounted closer to the wafer-probe (85) in order to avoid the loss of the RF cable (80), it would hit the microscope. Because of drastically increasing insertion loss of flexible and semi-rigid cables and adapters with frequency and the decreasing travel length of the tuning probe (because of the decreasing wave-length) at millimeter-wave frequencies this configuration is inadequate. A new drastically smaller tuner is needed, which is the subject of this invention.

The new solution is shown in FIG. 9; it uses the concept of the tuner in FIG. 5 and the disc probe of FIG. 6; the compact tuner (93) is held in place by a 3-axis micro-positioner (96), which is anchored on the support table (98); the tuner is mounted at the same angle as the connector of the wafer-probe (95) and is directly attached to it. Wafer-probes come typically with connectors angled 90, 45 or 30 degrees. This invention supports 45- and 30-degree wafer-probes. The wafer-probe provides direct access to the semiconductor wafer. The wafer-probe is controlled by the 3-axis tuner and probe micro-positioner (96) together with the tuner (93) as one unit. The idle port of the tuner is connected to an extension cable (94) which allows for horizontal, lateral and vertical movement of the probe-tuner assembly. The insertion loss (97) of this configuration is drastically reduced, in comparison with the configuration of FIG. 8 (item 87). The new setup also does not create a conflict with the microscope (801).

Figure 12:
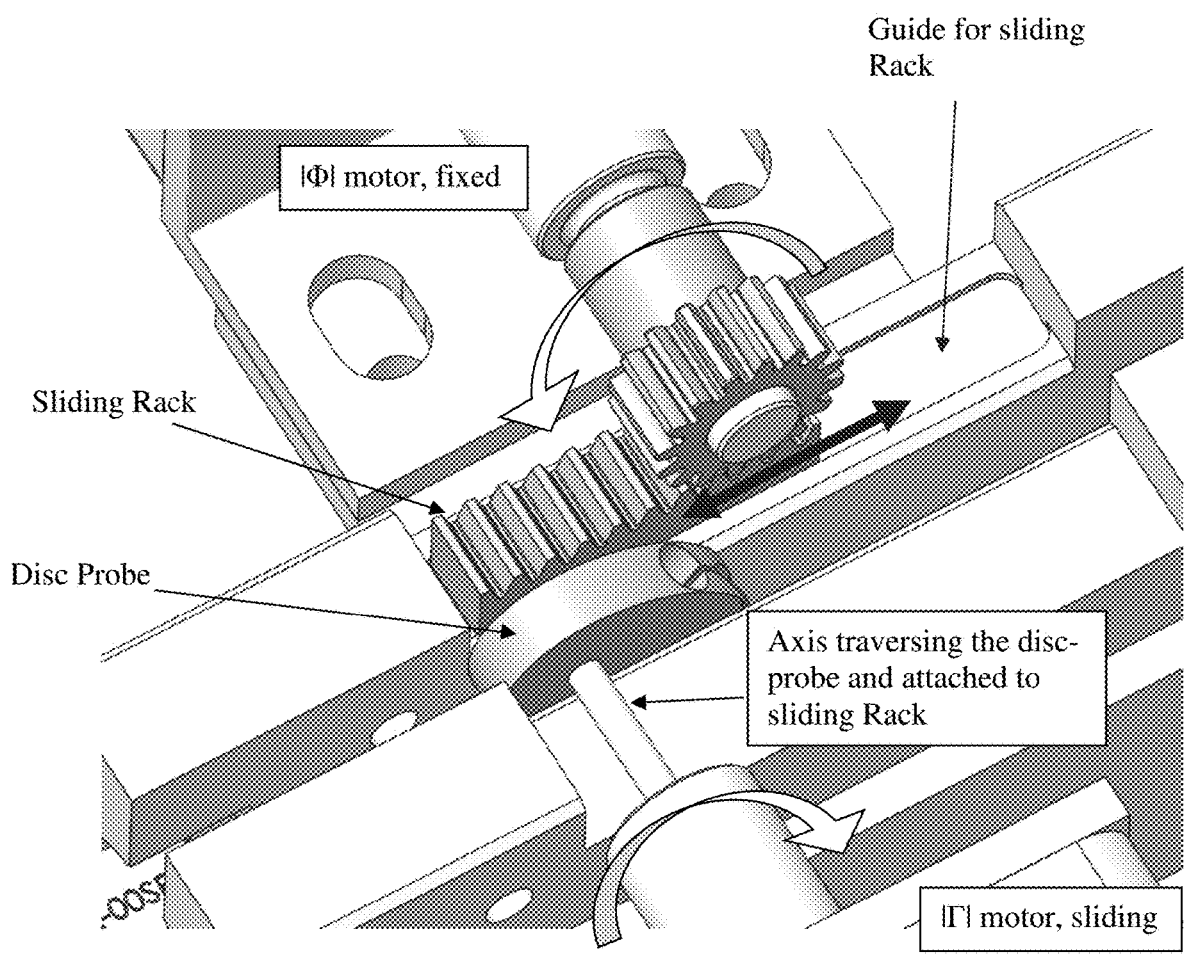
FIG. 12 depicts a detailed 3D view of the core of the compact millimeter-wave tuner.

The overall structure of the compact millimeter-wave tuner is shown in FIG. 11 and the core detail in FIG. 12; the motor (110) is permanently anchored on the slabline. It controls the rotation of the pinion. The pinion (53) moves the sliding rack (FIG. 12), which slides on rail (112), and on which the axis of the mobile motor (111) is anchored; motor (111) holds the disc probe, which has a concave rim (FIG. 6B), and controls its rotation phase Φ and the coupling (603) of the probe with the center conductor (62) and by that amplitude of T as shown in FIG. 6A.

Figure 13:
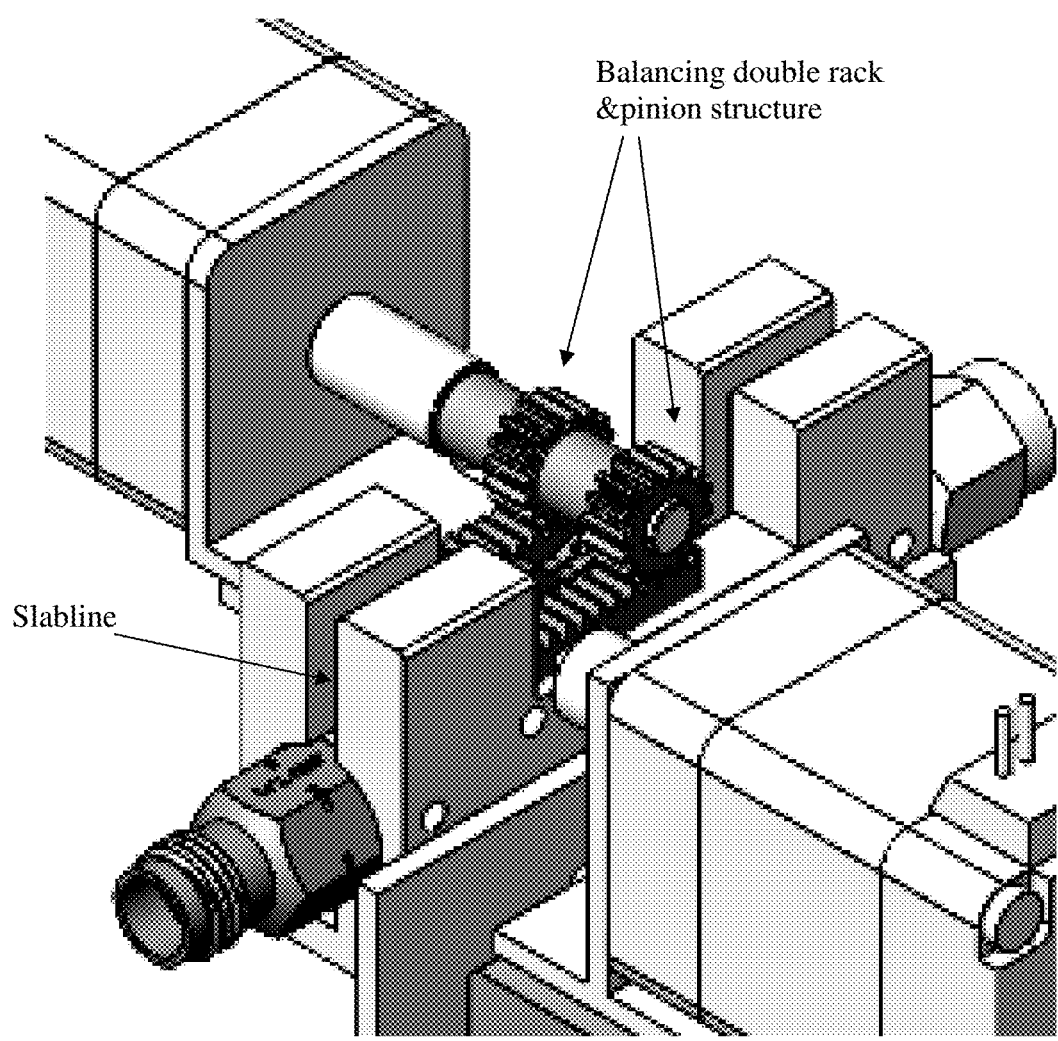
FIG. 13 depicts a detailed 3D view of alternative embodiment, wherein a twin rack-and-pinion gear mechanism ensures a better stability and movement control of the tuning probe.

FIG. 13 depicts a detailed 3D view of an alternative embodiment, wherein a double rack-and-pinion gear mechanism is used to pull on both sides of the main cause of resistive force in the system, which is the friction of the tuning probe against the sidewalls of the slabline.

The setup, including the tuner(s), must be calibrated before it can be used. Calibration comprises calibration of the vector network analyzer (VNA), the setup components such as couplers, test fixtures, adapters etc. and the tuner(s), (FIG. 1); since this invention applies only on "on-wafer" test setups, where the wafer-probes are the test fixtures, the wafer-probes must be part of a calibration, either in form of a test fixture or as part of the tuner(s), which is the natural approach, since the nature of the compact tuners allows them to be directly connected to the wafer-probes.

The calibration of the compact tuner(s) comprises measuring the scattering (s-) parameters of the tuner twoport for all intended tuner states; these states are defined by the rotation angle and the horizontal position of the disc-probe(s). These correspond to the rotation angle of the motors 110 and 111 and are saved in calibration files for any user defined frequency, available for later use. Calibration occurs using the vector network analyzer (VNA) with the tuner being either (a) a separate unit (FIG. 5A) or (b) the tuner being part of the measurement system; this second method is called "in-situ calibration" (FIG. 9 or 14).

In the first case (a) (the tuner is a separate unit) first the VNA is calibrated, for a set of frequencies Fmin≤F≤Fmax at its extended coaxial test ports using flexible cables (140) and (141), see FIG. 14A; then, in the case of FIG. 9, the tuner is connected to the coaxial ends of those cables and between its test (50) and idle (55) ports and the s-parameters of the tuner twoport are measured at a given test frequency F, included in the VNA calibration, for a multitude of tuning-probe states, typically selected to cover a large area of the Smith chart, and saved in the matrix format [Sij(M1,M2)], wherein {i,j}={1,2} and M1, M2 are the motor positions (steps) which are the best choice of stimulus for this application. The remaining components of the setup (wafer-probes, cables, adapters, couplers etc. see FIG. 1) are calibrated at their coaxial ports separately and are embedded (their s-parameter are matrix-cascaded) in computer memory (see ref. 6 and 8). Other than in prior art (FIG. 3), though, the stimulus is not the horizontal carriage X and the vertical probe position Y (even though also there the real stimulus are the motor positions, translated to linear movement through ACME screws and gear); instead, here the two independent stimuli are directly the rotation angles (steps) of the two stepper motors, M1 (111) and M2 (110) in FIG. 11, as mentioned above.

In the second case (b) the tuner is calibrated "in-situ", i.e. as part of the setup; to do so the VNA system must be pre-calibrated not at coaxial (140, 141) reference plane but at wafer-probe reference plane (at the probe tips) with all tuners initialized (i.e. the disc-probes withdrawn—turned out, angle Φ≈'180° in FIG. 6A), see also FIGS. 9 and 14; the preferred system calibration method is TRL (Thru-Reflect-Line, see ref. 6 and 8) even though other methods can also be used. To avoid confusion: "System Calibration" is a method that configures and allows the VNA to measure s-parameters at any given reference plane. "Tuner Calibration" uses the VNA "system calibration" to measure tuner s-parameters. TRL calibration is a system calibration that yields the error-correction coefficients between the internal VNA sensors and the (user defined) reference planes of the measurement, in this case (b) the wafer-probe tips. The "in-situ" tuner calibration is mechanically more delicate since it involves the wafer-probes as part of the calibration. But it is more accurate since it avoids errors due to connect-disconnect operations of the tuner with the wafer-probe (95) and the extension cable (94). It is also a more intuitive solution, since the tuner is supposed to be part of the setup.

For this operation the "extended" tuner(s) are calibrated "on-wafer" between ports (142) and (143), FIG. 14B. The output tuner is calibrated "in-situ" between the tip of the wafer-probe (95) and the output port (item 99 in FIG. 9, or item 142 in FIG. 14B); this extended tuner thus starts at the wafer-probe (95), includes the tuner (93) itself and the cable (94) and ends at the coaxial adapter (99) of the cable (94). Further on, tuner calibration procedure is performed as in case (a) for each extended tuner. In the case of source and load pull the output tuner is initialized (disc-probe withdrawn or turned out) before the input tuner is calibrated between ports (143) in FIG. 14B and the tip of the input wafer-probe (90), as described before in combining FIG. 9 with FIG. 14B. The output tuner, on the other hand, is calibrated for a multitude of disc-probe positions with the input tuner initialized between the tip of the output wafer-probe (95) and the port (142).

Prior art tuner interpolation and tuning algorithms apply similarly to ref. 4 and 5, wherein instead of X (horizontal) and Y (vertical) probe position stimuli, we now use M1 and M2 motor step (pinion angle) stimuli. In both cases the math is the same.

This invention discloses a new compact millimeter-wave slide screw tuner type, able to be mounted directly on a wafer-probe, and the associated setup. Obvious alternatives to the proposed disclosure shall not impede on the new concept of using a sliding rack moved by a fixed pinion, instead of a rolling pinion on fixed rack, which, in combination with a disc probe, allows creating a super compact millimeter-wave slide screw tuner.

What I claim as my invention is:

1. A compact millimeter-wave slide screw impedance tuner comprising
   a) a slabline comprising
      two metallic sidewalls having a first sidewall and a second sidewall,
      one test and one idle port with associated coaxial connectors, and
      a center conductor between the ports;
   b) a mobile rack, sliding freely on the top surface of the first sidewall;
   c) a first pinion attached to the axis of a first motor, said motor being anchored on the first sidewall, and
      wherein the pinion controls the sliding position of the rack;
   d) a metallic disc-shaped tuning probe with concave rim, which rotates eccentrically, inserted between the walls of the slabline and is attached to and controlled by the axis of a second motor;
   wherein
      the axis of the second motor traverses perpendicular the rack through a hole in the rack and holds the disc probe,
   and wherein
      the second motor is mounted on a bracket which slides, together with the sliding rack, parallel to the slabline.

2. The tuner as in claim 1, wherein the tuning disc-probe is oval.

3. The tuner as in claim 1, wherein the tuning disc-probe is elliptical.

4. The tuner as in claim 1,
   wherein
      a second sliding rack is mounted on the top surface of the second sidewall of the slabline, parallel to and symmetrically to the first rack relative to a longitudinal axis of the slabline;
      and a second pinion controlling the sliding position of the second rack; said second pinion being attached to and controlled by the axis of the first motor,
   and wherein
      the axis of the second motor traverses the second rack perpendicular through a hole in the second rack.

5. A test setup comprising
   a) a tuner as in claim 1;
   b) a set of wafer-probes #1 and #2;
   c) flexible RF cables with coaxial connectors;
   d) a support table;
   e) a 3-axis tuner micro-positioner;
   f) a wafer-probe micro-positioner;
   g) auxiliary test instruments, comprising at least a signal source and a power meter;
   wherein
      wafer-probe #1 is connected to the input of a DUT,
      wafer-probe #2 is connected to the output of the DUT,
      the test port of the tuner is connected directly to wafer-probe #2,
      the 3-axis micro-positioner is anchored on the support table,
      the tuner is attached to the 3-axis micro-positioner,
      wafer-probe #1 is attached to the wafer-probe micro-positioner,
      wafer-probe #1 and the idle port of the tuner are connected to the auxiliary test instruments using the RF cables as follows:
         the wafer-probe #1 is connected to the signal source,
         the idle port of the tuner is connected to the power meter.

6. An in-situ calibration method of the setup of claim 5 comprising the following steps:
   a) connecting the wafer-probe #1 and the idle port of the tuner to the test ports of a vector network analyzer (VNA);
   b) withdraw (turn out) the disc-probe of the tuner;
   c) perform TRL calibration of the VNA at wafer-probe reference plane at selected frequencies;
   d) set the rotation angle and the horizontal position of the disc-probe at a multitude of states, measure s-parameters at one or more of the selected frequencies and save in calibration files for later use.

7. A test setup comprising
   a) two tuners as in claim 1, an input tuner and an output tuner;
   b) a set of wafer-probes #1 and #2;
   c) flexible RF cables with coaxial connectors;
   d) a support table;
   e) two 3-axis tuner micro-positioners;
   f) auxiliary test instruments, comprising at least a signal source and a power meter;
   wherein
      wafer-probe #1 is connected to the input of a DUT,
      wafer-probe #2 is connected to the output of the DUT,
      the test port of the input tuner is connected directly to wafer-probe #1,
      the test port of the output tuner is connected directly to wafer-probe #2, the 3-axis micro-positioners are anchored on the support table,
      the tuners are attached to the 3-axis micro-positioners,
      the idle ports of the tuners are connected to the instruments using the RF cables as follows:
         the idle port of the input tuner is connected to the signal source,
         the idle port of the load tuner is connected to the power meter.

8. An in-situ calibration method of the setup of claim 7 comprising the following steps:
   a) connecting the idle ports of the tuners to the test ports of a vector network analyzer (VNA);
   b) withdraw (turn out) the disc probes of both tuners;
   c) perform TRL calibration of the VNA at wafer-probe reference plane at selected frequencies;
   d) set the rotation angle and the horizontal positions of the disc-probe of the output tuner at a multitude of states, measure s-parameters at one or more of the selected frequencies and save in output calibration files for later use,
   e) withdraw (turn out) the disc-probe of the output tuner;
   f) set the rotation angle and the horizontal positions of the disc-probe of the input tuner at a multitude of states, measure s-parameters at the one or more selected frequencies and save in input calibration files for later use.

* * * * *